(12) United States Patent
Kao et al.

(10) Patent No.: US 8,043,933 B2
(45) Date of Patent: Oct. 25, 2011

(54) INTEGRATION SEQUENCES WITH TOP SURFACE PROFILE MODIFICATION

(75) Inventors: Chien-Teh Kao, Sunnyvale, CA (US); Xinliang Lu, Fremont, CA (US); Zhenbin Ge, San Jose, CA (US); Mei Chang, Saratoga, CA (US); Hoiman Raymond Hung, Cupertino, CA (US); Nitin Ingle, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 42 days.

(21) Appl. No.: 12/620,806

(22) Filed: Nov. 18, 2009

(65) Prior Publication Data
US 2010/0129982 A1    May 27, 2010

Related U.S. Application Data

(60) Provisional application No. 61/117,548, filed on Nov. 24, 2008.

(51) Int. Cl.
*H01L 21/76* (2006.01)

(52) U.S. Cl. ........ 438/430; 438/401; 438/412; 438/424; 438/432; 438/437; 257/E21.546

(58) Field of Classification Search .................. None
See application file for complete search history.

(56) References Cited

U.S. PATENT DOCUMENTS

| | | | |
|---|---|---|---|
| 6,261,925 B1 * | 7/2001 | Arghavani et al. ............ 438/437 |
| 2001/0008226 A1 | 7/2001 | Hung et al. | |
| 2004/0079728 A1 | 4/2004 | Mungekar et al. | |
| 2004/0248375 A1 | 12/2004 | McNeil et al. | |
| 2006/0076312 A1 | 4/2006 | McReynolds et al. | |
| 2006/0099756 A1 | 5/2006 | Kwon | |
| 2008/0026555 A1 | 1/2008 | Dubin et al. | |
| 2008/0246068 A1 | 10/2008 | Cheng et al. | |

FOREIGN PATENT DOCUMENTS

| | | |
|---|---|---|
| KR | 10-0691946 | 3/2007 |
| KR | 2008-0038953 | 5/2008 |
| KR | 2008-0060568 | 7/2008 |

OTHER PUBLICATIONS

PCT International Search Report and Written Opinion dated Jun. 16, 2010 for International Application No. PCT/US2009/065088.

* cited by examiner

*Primary Examiner* — Matthew Smith
*Assistant Examiner* — Kyoung Lee
(74) *Attorney, Agent, or Firm* — Patterson & Sheridan, L.L.P.

(57) ABSTRACT

Embodiments of the present invention generally relates to an apparatus and a method for processing semiconductor substrates. Particularly, embodiments of the present invention relates to apparatus and methods for forming shallow trench isolations having recesses with rounded bottoms. One embodiment of the present invention comprises forming a recess in a filled trench structure by removing a portion of a material from the filled trench structure and rounding bottom corners of the recess. Rounding bottom corners is performed by depositing a conformal layer of the same material filled in the trench structure over the substrate and removing the conformal layer of the material from sidewalls of the recess.

20 Claims, 16 Drawing Sheets

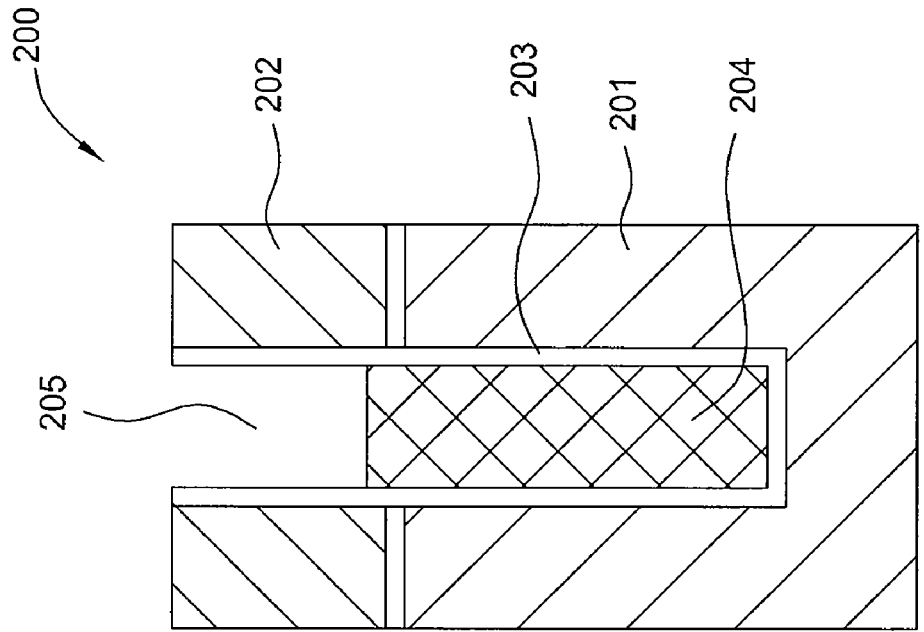
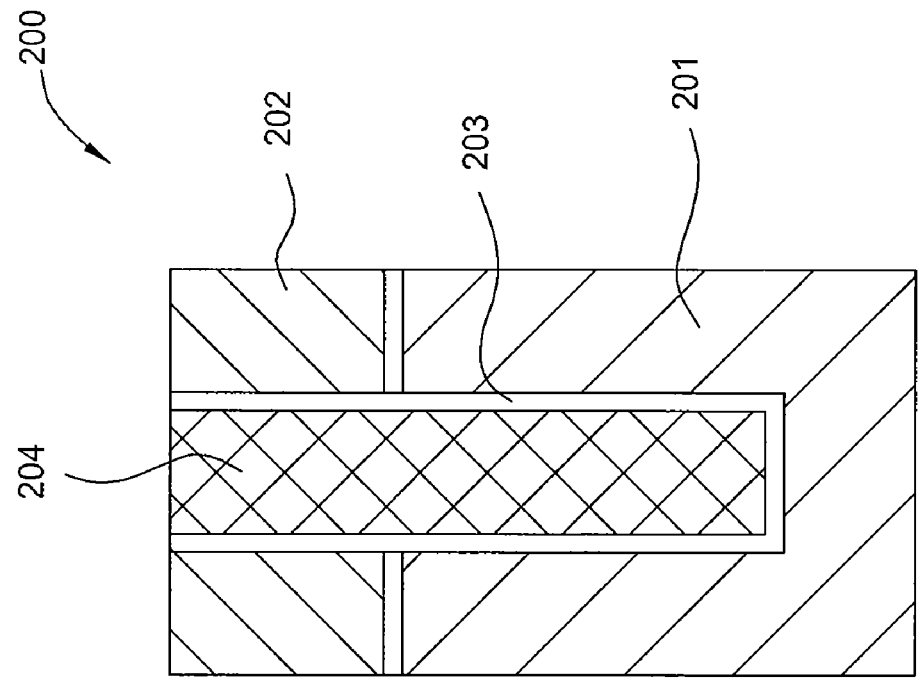
FIG. 2A
FIG. 2B

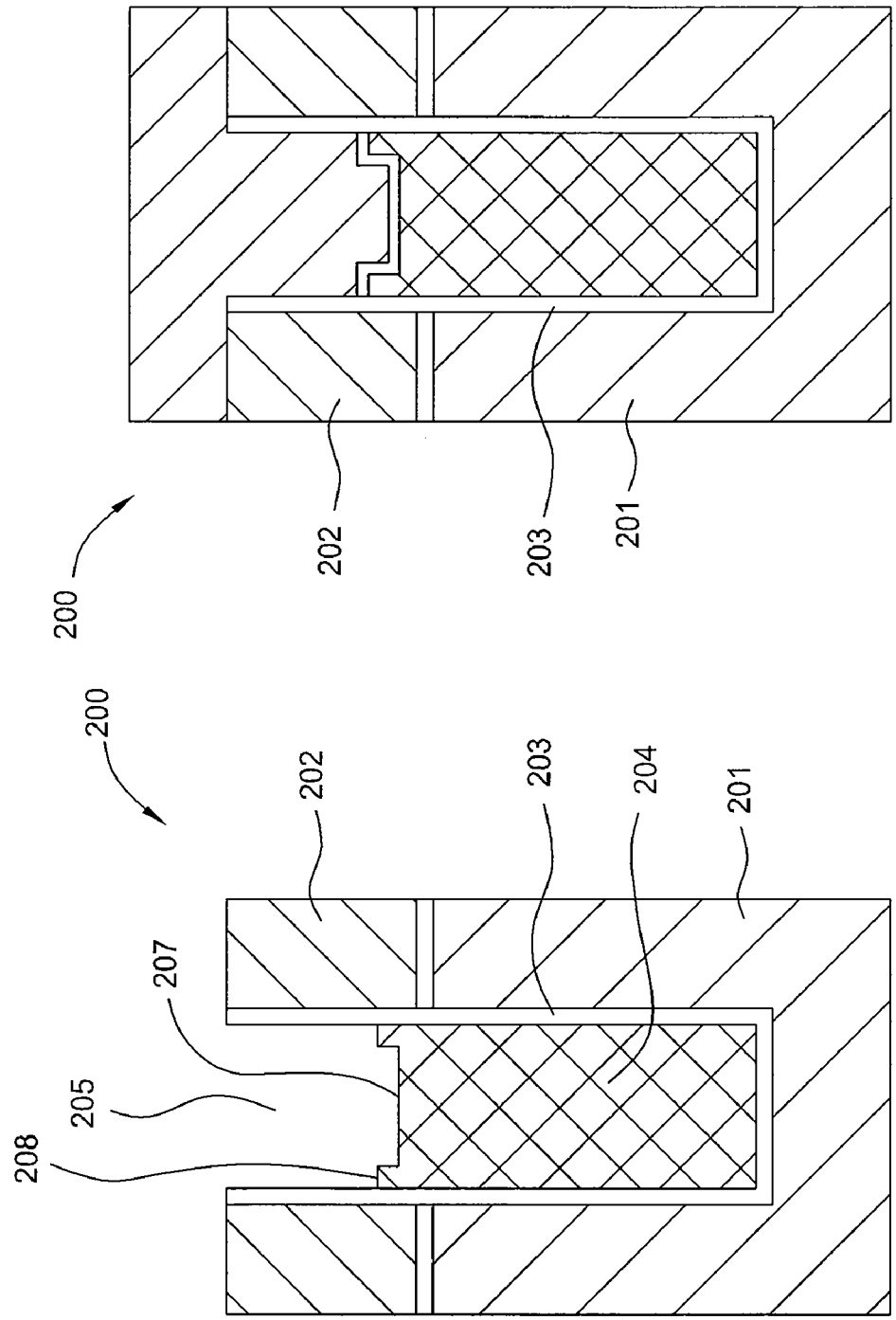

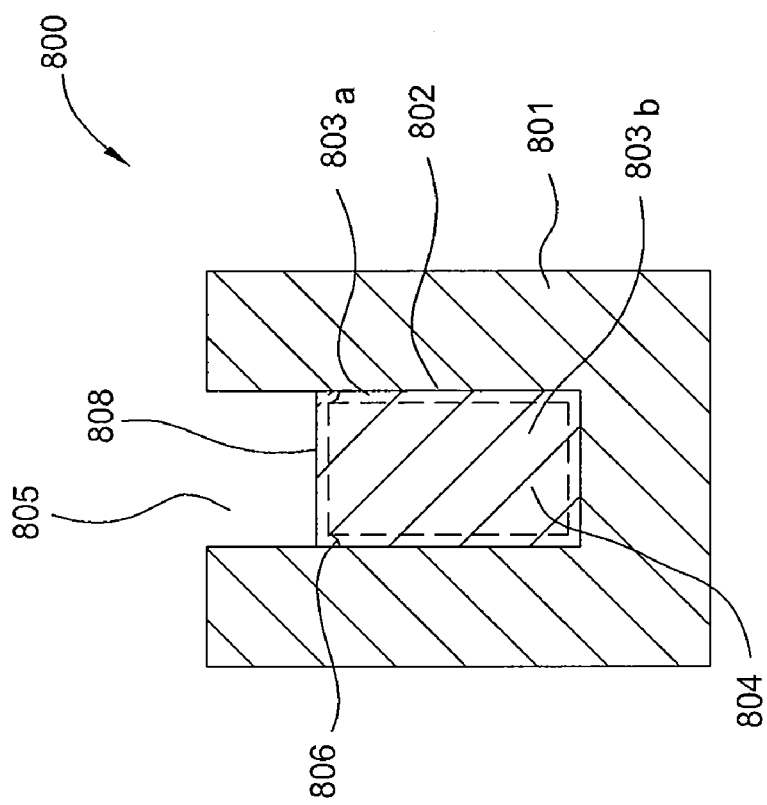
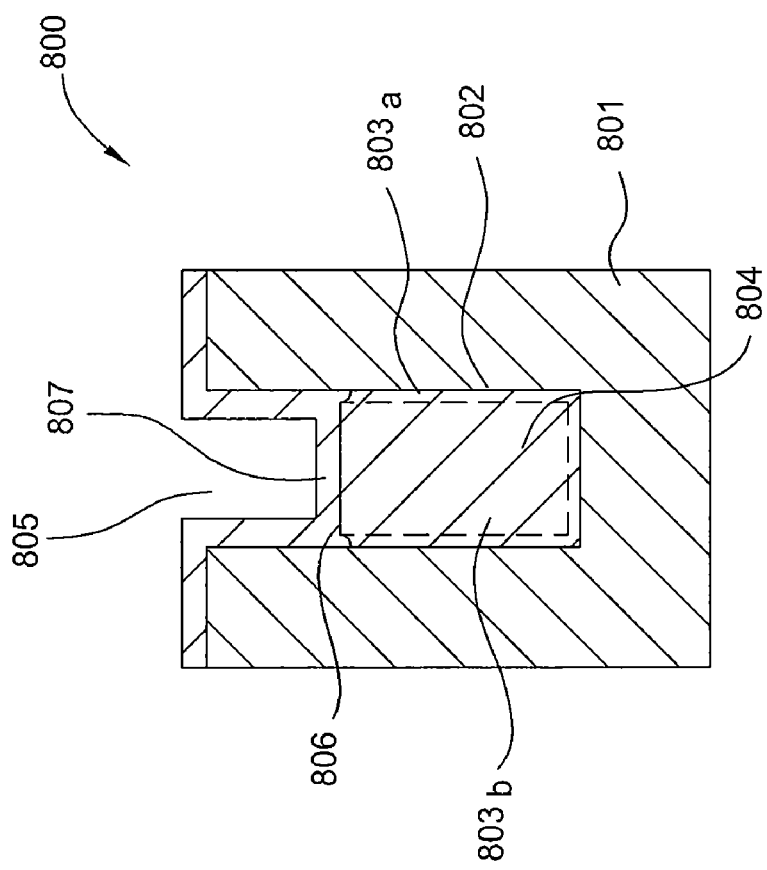
FIG. 8D
FIG. 8C

INTEGRATION SEQUENCES WITH TOP SURFACE PROFILE MODIFICATION

CROSS-REFERENCE TO RELATED APPLICATIONS

This application claims benefit of U.S. provisional patent application Ser. No. 61/117,548, filed Nov. 24, 2008, which is herein incorporated by reference.

BACKGROUND OF THE INVENTION

1. Field of the Invention

Embodiments of the present invention generally relate to an apparatus and a method for processing semiconductor substrates. Particularly, embodiments of the present invention relates to apparatus and methods for forming shallow trench isolations having recesses with rounded bottoms.

2. Description of the Related Art

As critical dimension of semiconductor devices decreases, distances between neighboring devices formed on a semiconductor substrate are also shortened. As a result, crosstalk among signals for neighboring devices also increases.

FIG. 1 is a simplified schematic figure of a memory device 100 formed on a silicon substrate 101. Generally, active areas 108 for individual memory cells are separated by shallow trench isolations (STI) 104. The active areas 108 are generally doped areas in the silicon substrate 101 and the shallow trench isolations 104 are generally silicon oxide filled in a lower portion of trench structures 112 formed in the substrate 101. Floating gates 103 are formed above the active areas 108 with an insulative layer 102 formed therebetween. Control gates 105 are formed from an upper portion of the trench structures 112. The floating gates 103 and the control gates 105 usually comprise polycrystalline silicon. Insulative layers 107, 110 are generally formed within and above the trench structures 112.

In the state of the art memory device, as shown in the memory device 100 of FIG. 1, crosstalk is problematic, particularly crosstalk near area 106 between the control gates 105 and the active areas 108.

One solution to reduce crosstalk between control gates and active areas within a memory device is to increase distance between the control gates and the active areas by forming recessed shallow trench isolation structures. However, the state of the art methods for forming recessed shallow trench isolation structures are very complicated involving a number of added process steps and requiring additional production equipment.

FIGS. 2A-2F schematically illustrate one state of the art sequence for forming recessed shallow trench isolation structures.

FIG. 2A schematically illustrates a substrate section 200. A polycrystalline silicon layer 202 is deposited on a silicon substrate 201. A trench 203 is formed through the polycrystalline silicon layer 202 and into the silicon substrate 201. The silicon oxide 204 is then filled in the trench 203. A planarization process is usually followed to expose the polycrystalline silicon layer 202 after filling the trench 203 with the silicon oxide 204.

FIG. 2B schematically illustrates a result structure after an etching process that removes a portion of the silicon oxide 204 in the trench 203 and forms a recess 205.

A silicon nitride layer 206 is then deposited over the recess 205 and the polycrystalline silicon layer 202 as shown in FIG. 2C.

An anisotropic nitride etching process is then performed to remove the silicon nitride layer 206 from over a bottom 207 of the recess 205 and over the polycrystalline layer 202 leaving only vertical sections of the nitride layer 206 to protect sidewalls of the recess 205, as shown in FIG. 2D. A silicon oxide etching process is followed to remove silicon oxide 204 from the bottom 207 of the recess 205, as shown in FIG. 2D.

A nitride etching process is then need to remove the silicon nitride layer 206 from the sidewalls of the recess 205. A step 208 is then formed in the recess 205, as shown in FIG. 2E.

In FIG. 2F, a recessed shallow trench isolation that would reduce cross talk may be formed over the step 208.

The sequence shown in FIGS. 2A-2F requires four extra processes, silicon nitride deposition, anisotropic nitride etching, silicon oxide etching, and nitride etching, to form a recessed shallow trench isolation (shown in FIG. 2F) that would reduce crosstalk in the final device produced. The four extra processes require additional processing chambers and additional processing chemistry to the over all sequence of forming shallow trench isolation. As a result, the cost of ownership is greatly increased.

Therefore, there is a need for methods and apparatus for efficiently forming recessed shallow trench isolation structures to reduce crosstalk among devices formed in a semiconductor substrate.

SUMMARY OF THE INVENTION

Embodiments of the present invention generally relate to an apparatus and a method for processing semiconductor substrates. Particularly, embodiments of the present invention relates to apparatus and methods for forming shallow trench isolations having recesses with rounded bottoms.

One embodiment provides a method for processing a substrate comprising forming a trench structure in the substrate, wherein sidewalls of the trench structure comprises a first material, depositing a second material to fill the trench structure, planarizing the substrate to remove the first material deposited outside the trench structure, forming a recess in the filled trench structure by removing a portion of the second material from the filled trench structure, and rounding bottom corners of the recess, wherein rounding bottom corners comprises depositing a conformal layer of the second material over the substrate, and removing the conformal layer of the second material to expose the first material outside the trench structure.

Another embodiment provides a method for forming a shallow trench insulation structure comprising forming a trench structure through a layer of polycrystalline silicon, filling the trench structure with silicon oxide, planarizing the substrate to expose the layer of polycrystalline silicon on a surface of the substrate, etching back the silicon oxide to in the trench structure to form a recess in the trench structure, and rounding bottom corners of the recess comprising, depositing a conformal layer of silicon oxide over the surface of the substrate, and sidewalls and bottom of the recess, and removing the conformal layer of silicon oxide to expose the layer of polycrystalline silicon on the surface of the substrate.

Yet another embodiment provides a method for forming memory cells comprising providing a silicon substrate configured to form active areas of the memory cells therein, depositing a first polycrystalline silicon layer configured to form floating gates of the memory cells, forming trench structures through the first polycrystalline silicon layer into the silicon substrate, filling the trench structures with silicon oxide, planarizing the substrate to expose the first polycrystalline silicon layer, forming recesses with rounded bottoms in the trench structure, and depositing a second polycrystalline silicon layer configured to form control gates for the memory cells, wherein forming recesses with rounded bottoms comprises etching back a portion of the silicon oxide in the trench structures, depositing a conformal layer of silicon oxide over the surface of the substrate, and removing the conformal layer of silicon oxide to expose the first polycrystalline silicon layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A-2F schematically illustrate one state of the art sequence for forming recessed shallow trench isolation structures.

FIGS. 8A-8D schematically illustrate a sequence of forming a shallow trench isolation structure for a three dimensional transistor in accordance with one embodiment of the present invention.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relates to an apparatus and a method for processing semiconductor substrates. Particularly, embodiments of the present invention relates to apparatus and methods for forming shallow trench isolations having recesses with rounded bottoms. One embodiment of the present invention comprises forming a recess in a filled trench structure by removing a portion of a material from the filled trench structure and rounding bottom corners of the recess. Rounding bottom corners is performed by depositing a conformal layer of the same material filled in the trench structure over the substrate and removing the conformal layer of the material from sidewalls of the recess.

By depositing a conformal layer of the same material filled in a trench and then remove the conformal layer from sidewalls of a recess formed in the trench, a recess with a rounded bottom is created. The trench with a rounded bottom recess can be used in desired situations, such as in shallow trench isolation of a memory device to reduce crosstalk. Embodiments of the present invention do not require additional processing chambers or additional processing recipes since the same material is deposited and removed. As a result, embodiments of the present invention provide solution for reducing crosstalk in memory cells without greatly increasing the cost of production. Furthermore, by using the same chemistry, embodiments of the present invention also avoid unnecessary exposure to contamination, thus reducing defects.

Figure 1:
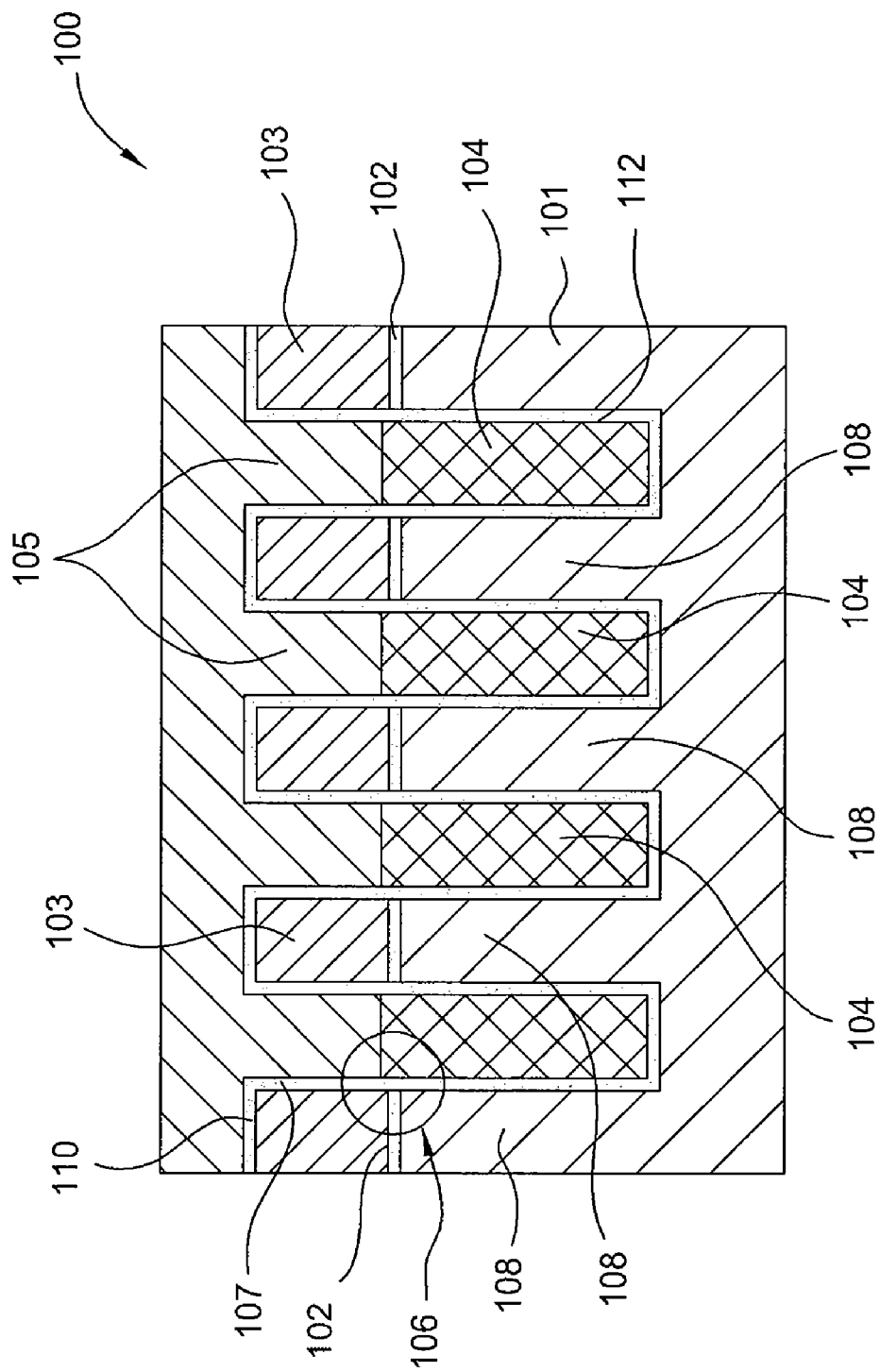
FIG. 1 is a schematic sectional view of a memory device of prior art.
Figure 2C:
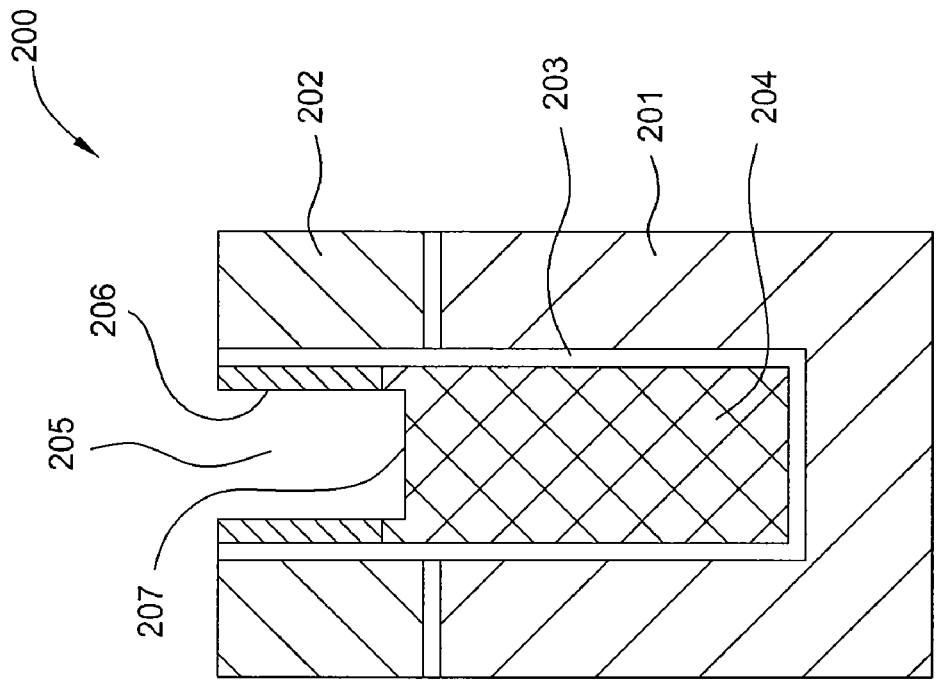
Figure 2D:
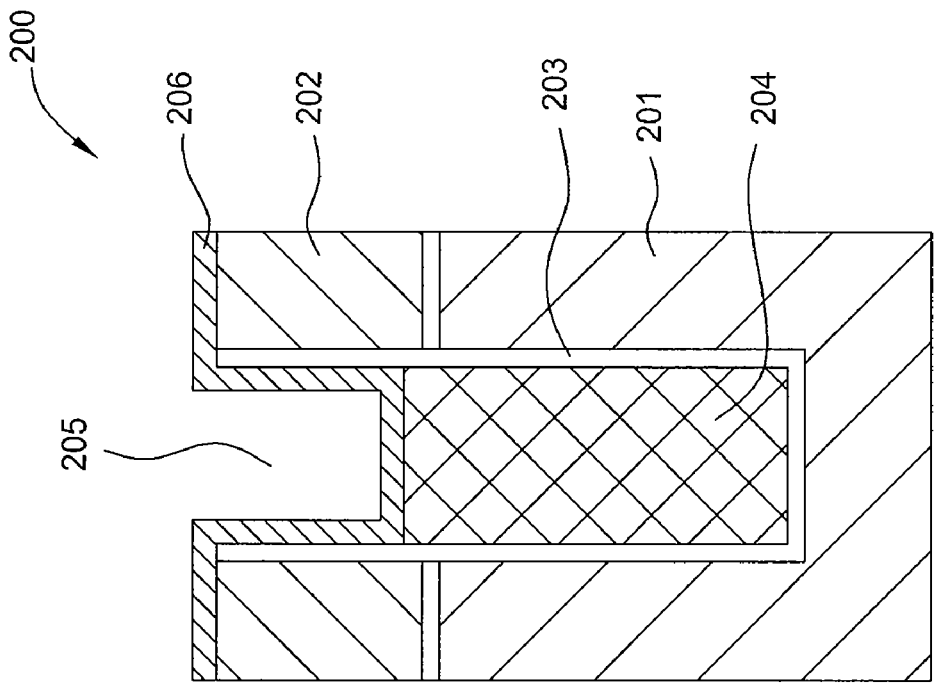
Figure 3A:
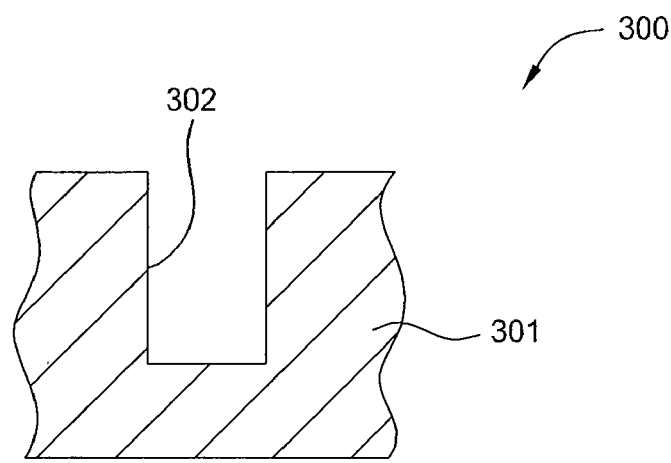
FIGS. 3A-3F schematically illustrate a sequence of forming a recess with a rounded bottom in accordance with one embodiment of the present invention.
Figure 3B:
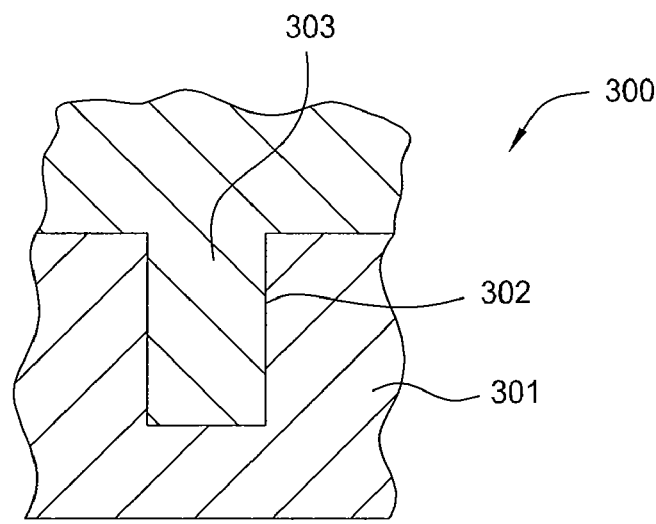
Figure 3C:
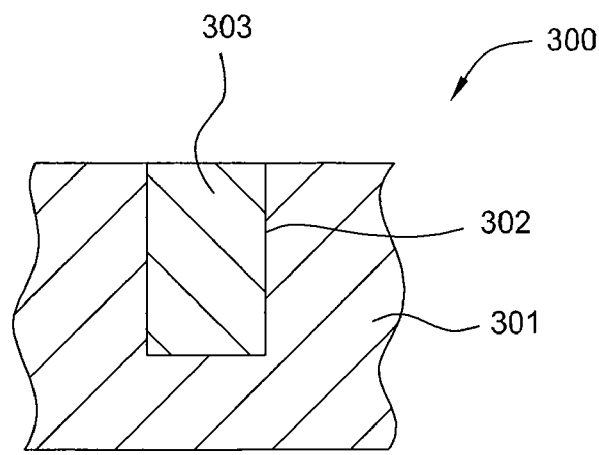

FIGS. 3A-3F schematically illustrate a sequence of forming a recess with a rounded bottom in accordance with one embodiment of the present invention. FIG. 4 is a schematic flow chart of a method 400 for forming the recess with a rounded bottom shown in FIGS. 3A-3F.

Block 410 of the method 400 comprises forming a trench structure in substrate wherein sidewalls of the trench structure comprises a first material. FIG. 3A schematically illustrates formation of a trench structure 302 formed in a first material layer 301 of a substrate 300. In one embodiment, the first material layer 301 comprises silicon.

Block 420 of the method 400 comprises depositing a second material on the substrate to fill the trench structure. As shown in FIG. 3B, the trench structure 302 is filled with a second material 303. In one embodiment, the second material is silicon oxide which may be filled in the trench structure 302 using chemical vapor deposition.

Block 430 of the method 400 comprises planarizing the substrate to remove the second material from areas outside the trench structure. As shown in FIG. 3C, the substrate 300 is planarized so that the first material layer 301 is exposed. In one embodiment, the planarization may be performed by polishing, such as chemical mechanical polishing (CMP).

Block 440 of the method 400 comprises forming a recess in the trench structure by selectively removing a portion of the second material filled in the trench structure. In one embodiment, an etchant having a higher etching rate against the second material than against the first material is used to selectively remove a portion of the second material and form a recess in the trench structure. However, any suitable methods can be used to form a recess.

Figure 3D:
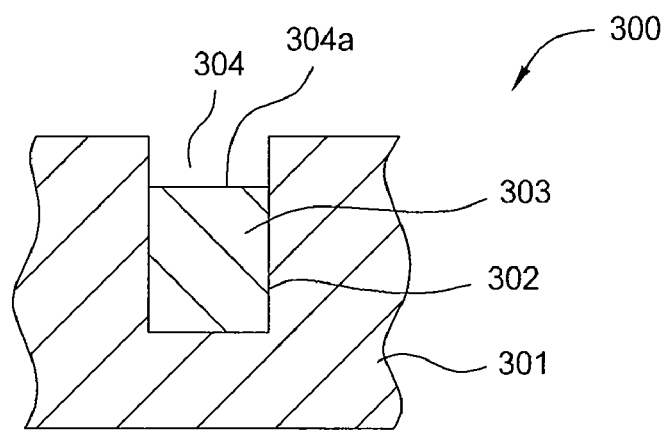
Figure 4:
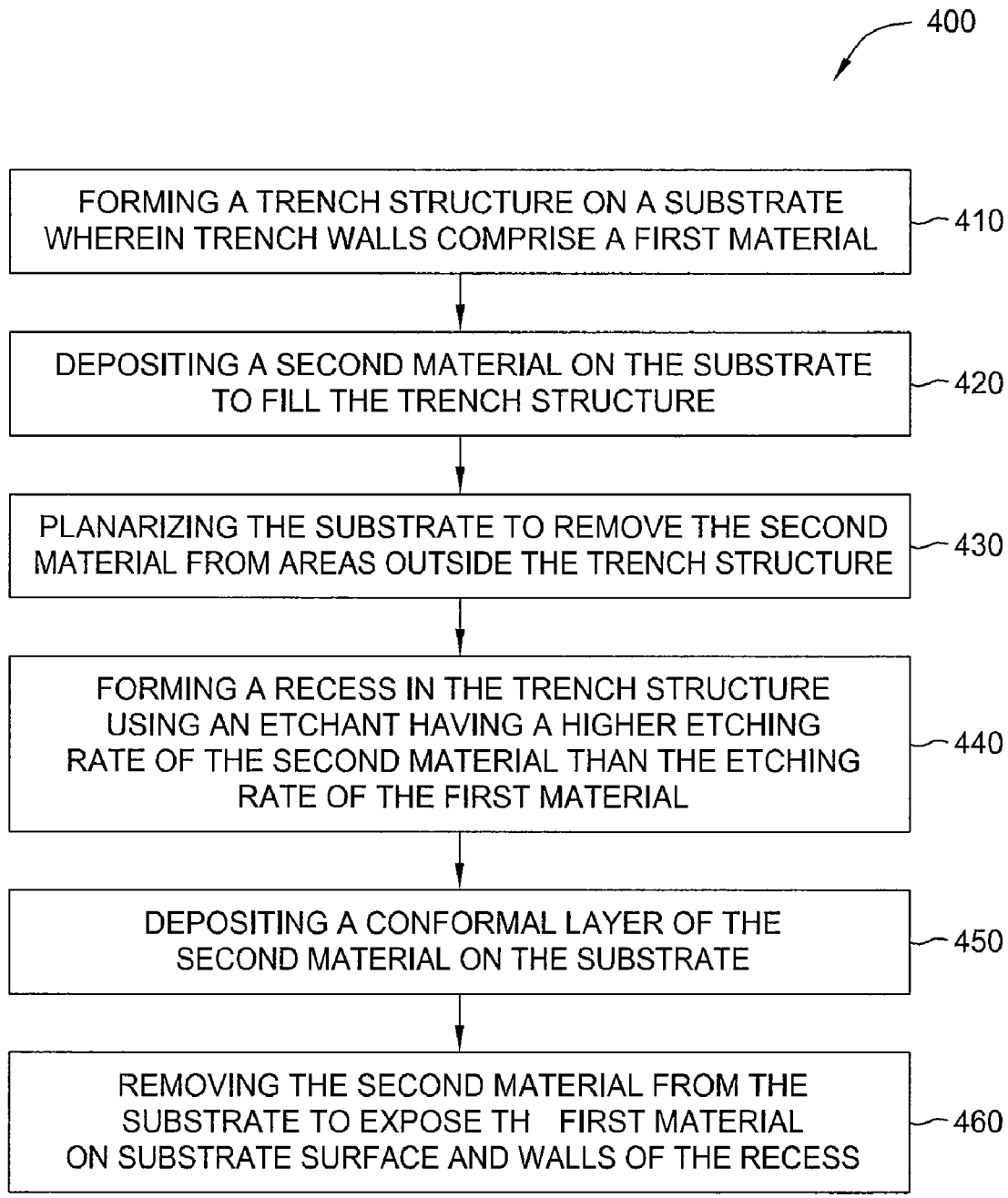
FIG. 4 is a schematic flow chart of a method for forming a recess with a rounded bottom in accordance with one embodiment of the present invention.

FIG. 3D illustrates that a recess 304 is formed in the trench structure 302. In one embodiment, the second material is silicon oxide, and forming the recess 304 is performed one of dry etching, wet etching, or buffered oxide etching. As shown in FIG. 3D, the recess 304 has relatively sharp corners at near the bottom.

Block 450 of the method 400 comprises depositing a conformal layer of second material on the substrate. In one embodiment, depositing the conformal layer is performed in the same processing chamber and using the same method as filling the trench structure in block 420. Therefore, no additional chamber is required for this step.

Figure 3E:
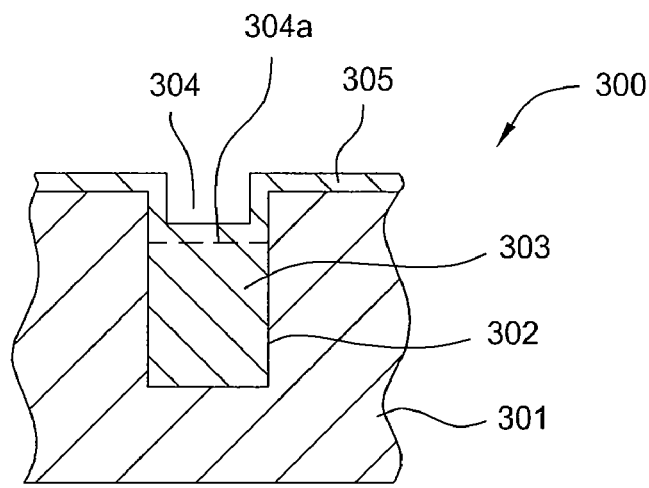

FIG. 3E illustrates that a conformal layer 305 of second material is deposited over the entire substrate 300 including bottom, sidewalls of the recess 304 and the expose first material layer 301.

Block 460 of the method 400 comprises removing the conformal layer of second material from the substrate to expose the first material on the substrate surface and sidewalls of the recess. In one embodiment, removing the conformal layer of the second material is performed using the same chamber and the same method as forming the recess in block 440. Therefore, no additional chamber is required for this step.

Figure 3F:
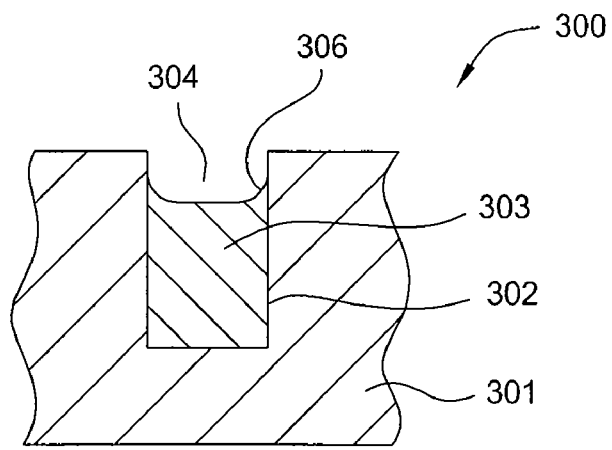

FIG. 3F illustrates the recess 304 having rounded corners 306 after removal of the conformal layer 305 of the second material from part of the sidewalls of the recess 304 and from top surface of the first material layer 301. In one embodiment, the conformal layer 305 of the second material is removed using an etching process and the rounded corners 306 may be formed as a result of the characteristics of the etching process, for example, faster depletion of etchant near the bottom corners than near the sidewalls and the bottom.

Figure 9:
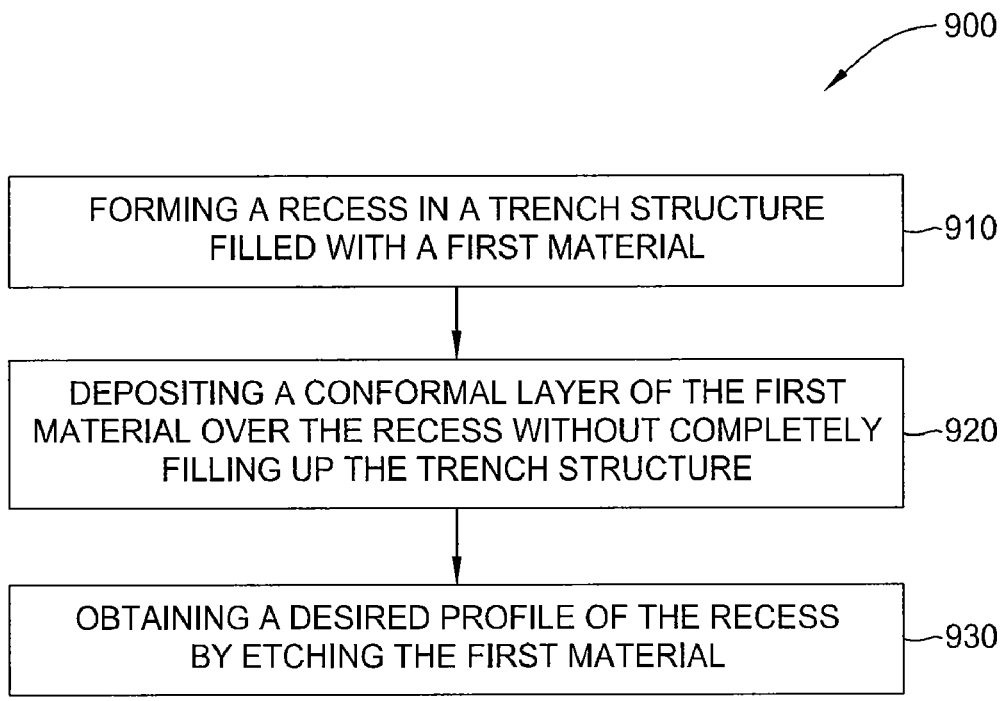
FIG. 9 is a flow chart of a method for modifying a recess profile in accordance with one embodiment of the present invention.

In another embodiment, methods of the present invention can be used modify a recess profile to a desired shape. FIG. 9 is a flow chart of a method 900 for modifying a recess profile in accordance with one embodiment of the present invention.

Block 910 of the method 900 comprises forming a recess in a trench structure filled with a first material. In one embodiment, the trench structure may be formed in a second material different from the first material. In one embodiment, forming the recess may be performed by according blocks 410 to 440 of the method 400, or any other sequences. The result recess may be similar to the recess 304 of FIG. 3D. However, a top profile 304a of the recess 304 may be of any shape, such as flat, convex, or concave. The shape of the top profile 304a is generally a result of the method forming the recess 304. However, the top profile 304a, in many cases, are not ideal. The method 900 is configured to modify the top profile 304a.

Block 920 of the method 900 comprises depositing a conformal layer of the first material over the recess. Thickness of the conformal layer may be determined by actual profile modification. In one embodiment, the deposition of the conformal layer does not filling up the recess. The conformal layer may be similar to the conformal layer 305 of FIG. 3E.

Block 930 of the method 900 comprises obtaining a desired profile of the recess by etching the first material. In one embodiment, the obtaining a desired profile may comprise determining etching parameters according to the desired profile. In one embodiment, the etching parameters may be one of etching time, and etching rate. In one embodiment, the determined etching rate may be implemented by setting a flow rate of a first processing gas, when a ratio of the first processing gas over a second processing gas is within a certain range, wherein the first processing gas and the second processing gas are configured to etch the first material.

Figure 10:
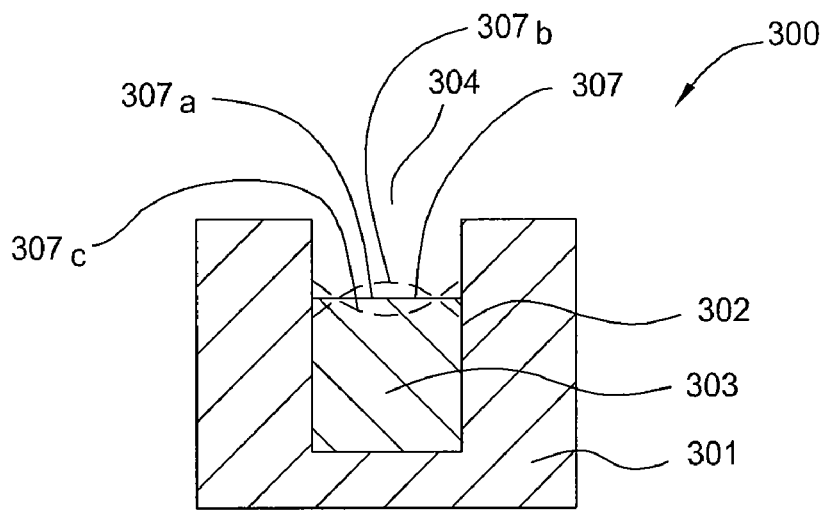
FIG. 10 is a schematic sectional side view of a recess with modified profile.

FIG. 10 is a schematic sectional side view of the recess 304 after an etching process described in Block 930. The recess 304 has a modified top profile 307. In one embodiment, the modified top profile 307 may be a flat profile 307a, a convex profile 307b, or a concave profile 307c. Different profiles may be needed in different devices. For example, in forming shallow trench isolation structures in a memory device, it is desirable to have a concave top profile in the recess, and in forming three dimensional transistors, it is desirable to have flat to profile in recesses wherein wrap around gates are to be formed.

Different modified profiles may be achieved by adjusting thickness of the conformal layer, etching rate, etching time, or combinations thereof.

In one embodiment, the obtained recess profile may be determined by thickness of the conformal layer. A thicker conformal layer may result in more concave recess profile than a thinner conformal layer while other parameters remain the same.

In one embodiment, the obtained recess profile may be determined by etching time. A longer etching time results in more convex profile than a short etching time while other parameters are the same.

In one embodiment, a desired recess profile may be obtained by adjusting etching rate. In one embodiment, reducing the etching rate may enable easy modification of the recess profile.

Application on Memory Cells

FIGS. 5A-5D schematically illustrate a sequence of forming a shallow trench isolation structure for a memory device 500 in accordance with one embodiment of the present invention. FIG. 6 is a schematic flow chart of a sequence 600 for forming a shallow trench isolation structure for the memory device 500 shown in FIGS. 5A-5D.

Generally, a memory device comprises a plurality of memory cells, usually formed on a silicon substrate. Selected areas of the silicon substrate are doped during the fabrication and serve as active areas for individual memory cells. Floating gates and control gates are to be formed over the silicon substrate. The floating gates and control gates enable reading and writing to each memory cell. Generally, active areas of individual memory cells are separated by shallow trench isolations, which are generally trenches filled with silicon oxide. The floating gates and control gates are formed and interlaced in polycrystalline silicon layers that subsequently deposited on the silicon substrate.

Figure 5A:
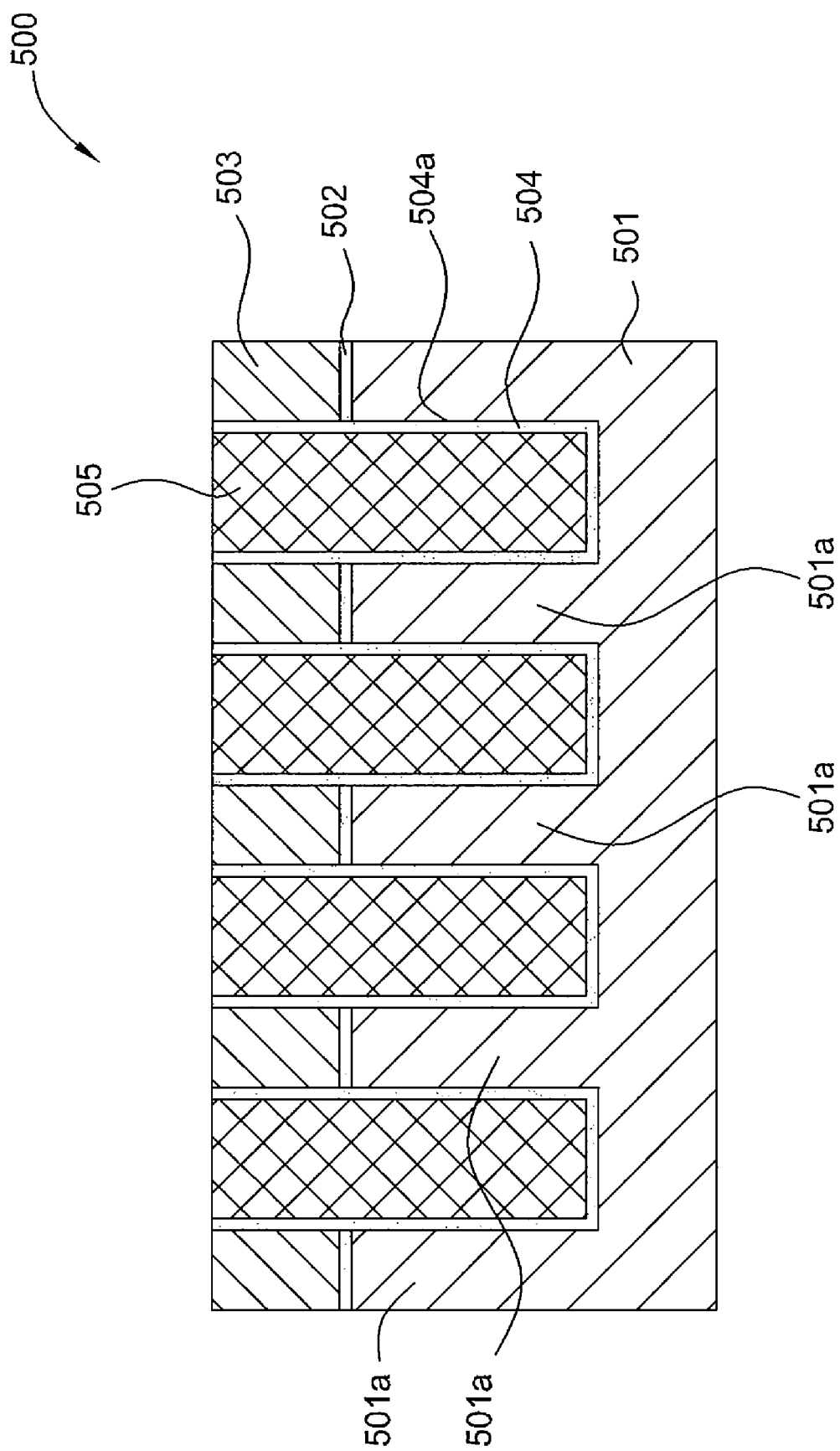
FIGS. 5A-5D schematically illustrate a sequence of forming a shallow trench isolation structure for a memory device in accordance with one embodiment of the present invention.
Figure 6:
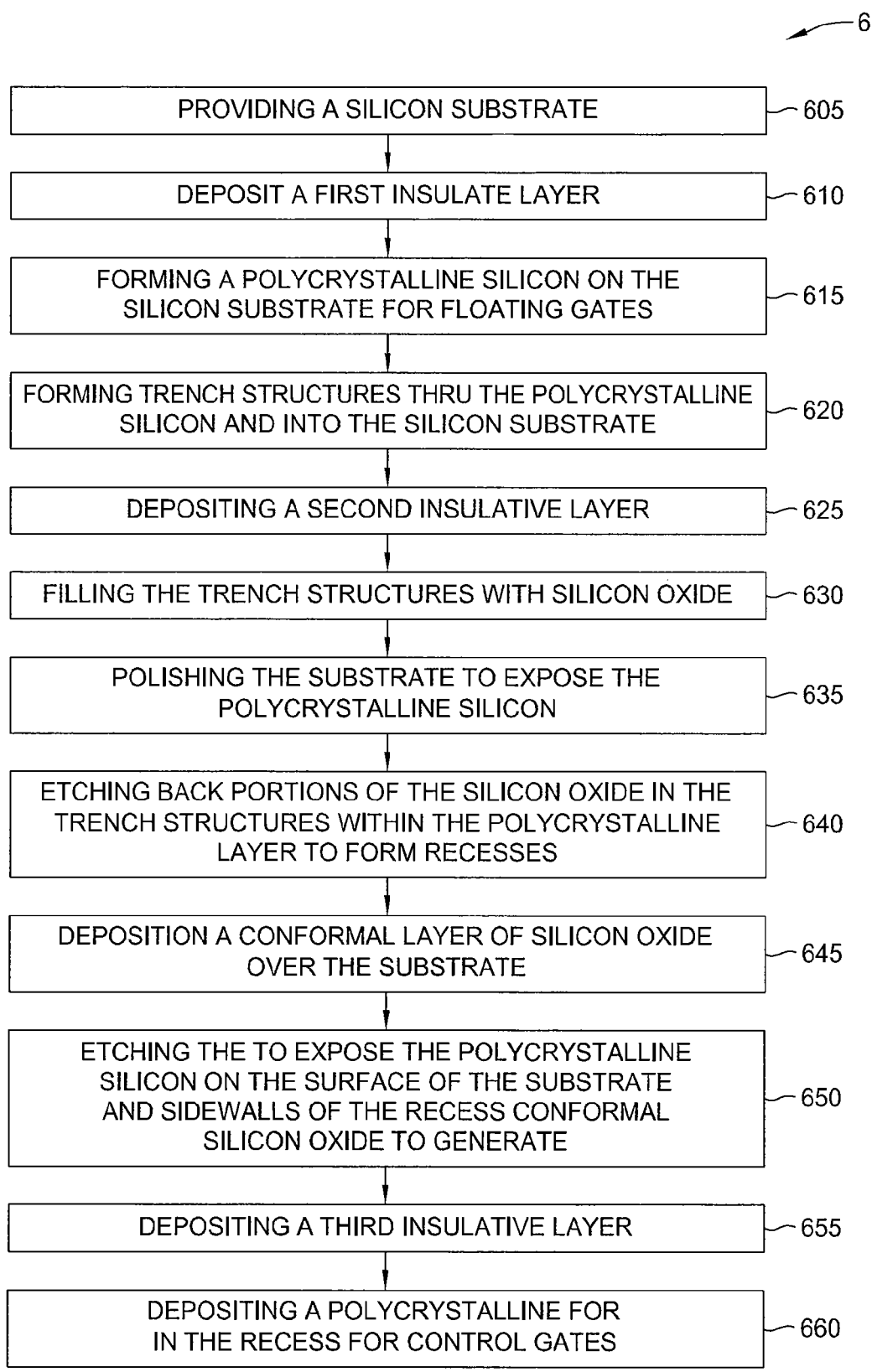
FIG. 6 is a schematic flow chart of a method for forming a shallow trench isolation structure for a memory device in accordance with one embodiment of the present invention.

Block 605 of the sequence 600 comprises providing a silicon substrate 501, shown in FIG. 5A, on which a memory device is to be produced.

Block 610 of the sequence 600 comprises depositing a first insulative layer 502 is formed over the silicon substrate 501.

A polycrystalline silicon layer 503 is then formed over the first insulative layer 502, as shown in block 615 of the sequence 600. The polycrystalline silicon layer 503 is configured to form floating gates therein.

Block 620 of the sequence 600 comprises forming trench structures 504a in through the polycrystalline silicon layer 503, the first insulative layer 502, and into the silicon substrate 501. The trench structures 504a divide the silicon substrate 501 into a plurality of active areas 501a, which would later belong to individual memory cells. Formation of the trench structures 504a may comprise forming a pattern using photolithography, etching, and removing the photoresist layer. The method for formation of the trench structure 504a is well known to people of the art.

Block 625 of the sequence 600 comprises depositing a second insulative layer 504 over the silicon substrate 501 to cover bottom and sidewalls of the trench structures 504a.

Block 630 of the sequence 600 comprises filling the trench structures 504a with silicon oxide 505.

Block 635 of the sequence 600 comprises polishing the substrate to expose the polycrystalline silicon layer 503. FIG. 5A schematically illustrates the memory device 500 at the stage after polishing.

Figure 5B:
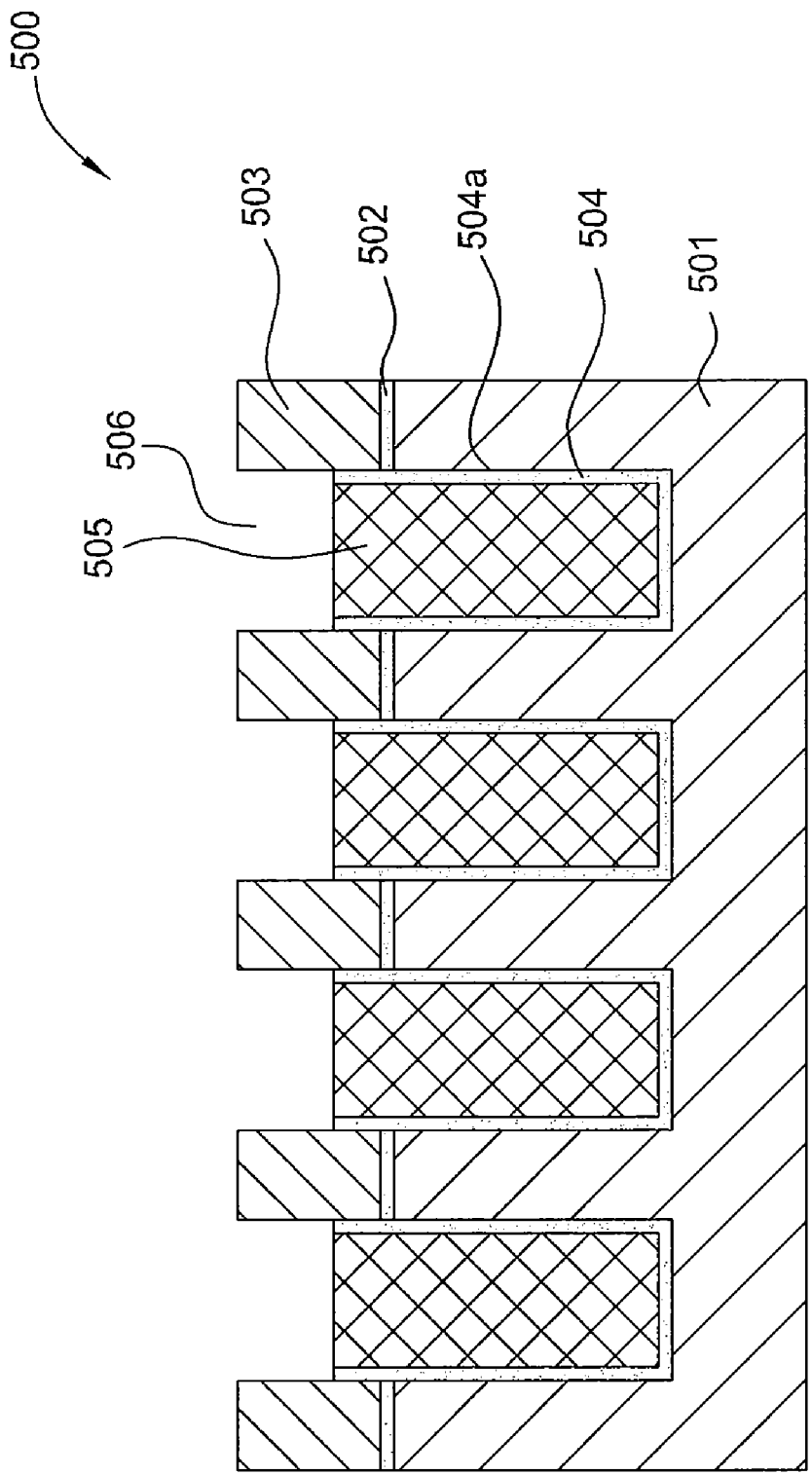

Block 640 of the sequence 600 comprises forming a recess 506 in the trench structures 504a by selectively removing a portion of the silicon oxide 505. In one embodiment, an etchant having a higher etching rate against silicon oxide than against polycrystalline silicon is used to selectively remove a portion of the silicon oxide 505. As shown in FIG. 5B, the recess 506 has a depth shorter than a thickness of the polycrystalline silicon layer 503. The recess 506 is configured to have control gates formed therein. Forming the recess 506 may be performed by one or more of dry etching, wet etching, or buffered oxide etching.

Figure 5C:
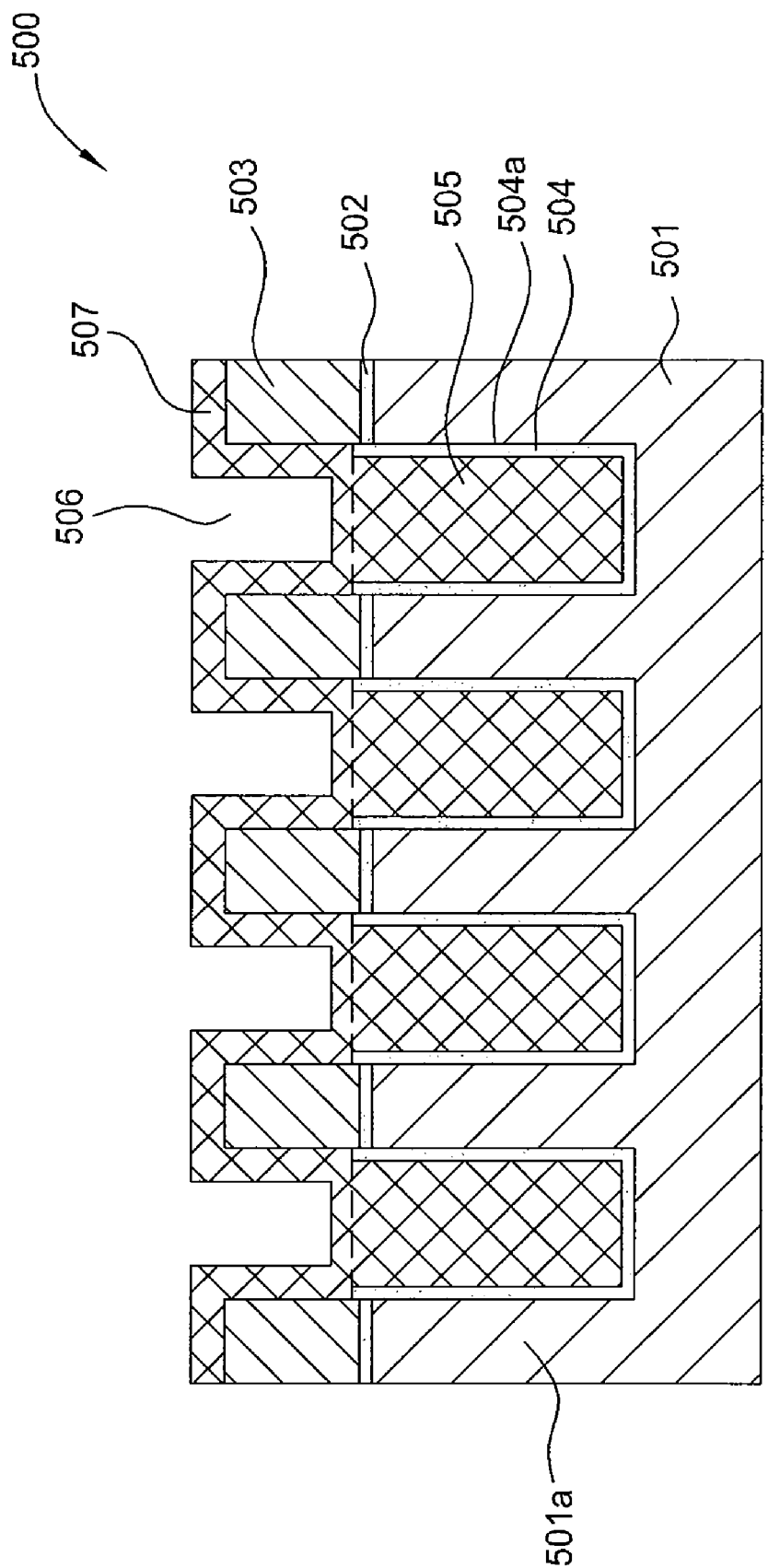

Block 645 of the sequence 600 comprises depositing a conformal layer of silicon oxide 507 as shown in FIG. 5C.

Block 650 of the sequence 600 comprises removing the conformal layer of silicon oxide 507.

Blocks 645, 650 are configured to form rounded corners 508 at the bottom of the recesses 506. In one embodiment, processing parameters of blocks 645, 650 can be adjusted to achieve different curvature of the rounded corner 508. In one embodiment, thickness of the conformal layer of silicon oxide 507 and/or etching rate of block 650 can be used to adjust the dimension of the rounded corner 508.

Figure 5D:
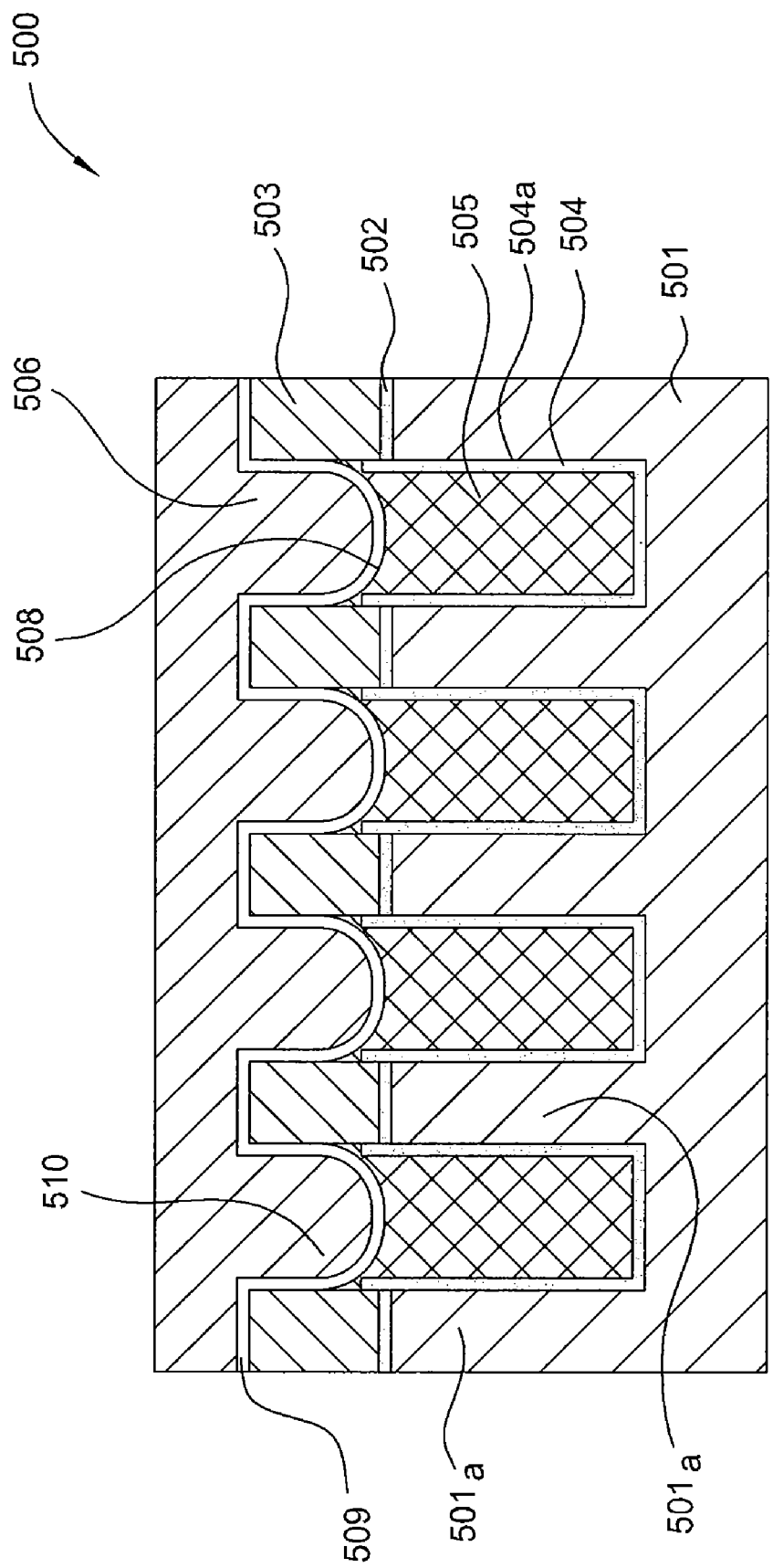

In one embodiment, blocks 645, 650 are shorter versions blocks 630, 640 respectively using the same chambers and the same process chemistry. As a result, corners of the recesses 506 are rounded as shown in FIG. 5D without dramatically increasing the cost.

Even though, using the same chambers and the same process chemistry in blocks 645, 630 and blocks 650, 640 reduces cost, it is contemplated to that the processes can be performed separately. In one embodiment, blocks 645, 630, or blocks 650, 640 may be performed using separate chambers respectively. In another embodiment, blocks 645, 630, or blocks 650, 640 may be performed using different chemistry.

In one embodiment, when the second material is silicon oxide, a SICONI™ etching method is used in both forming the recess 506 in block 645 and forming the rounded corners 508 in block 650. In one embodiment, a SICONI™ etching method is a dry etching method for removing silicon oxides.

A SICONI™ etching method is a dry etch process for removing one or more silicon oxides using an ammonia ($NH_3$) and nitrogen trifluoride ($NF_3$) gas mixture performed within a plasma processing chamber.

A SICONI™ etching method begins by placing a substrate, such as the memory device 500 shown in FIG. 5C, into a plasma processing chamber. The substrate may be chucked to an upper surface of a support member. The substrate is chucked to the upper surface of the support member by pulling a vacuum, or using an electrostatic form. The support member is then lifted to a processing position within the chamber, if not already in a processing position. In one embodiment, the chamber body is preferably maintained at a temperature of between 50° C. and 80° C., more preferably at about 65° C. This temperature of the chamber body is maintained by passing a heat transfer medium through heating and cooling channels formed in the chamber body.

The substrate is generally cooled below 65° C., such as between 15° C. and 50° C., by passing a heat transfer medium or coolant through fluid channels formed within the support member. In one embodiment, the substrate is maintained below room temperature. In another embodiment, the substrate is maintained at a temperature of between 22° C. and 40° C. Typically, the support member is maintained below about 22° C. to reach the desired substrate temperatures specified above. To cool the support member, the coolant is passed through the fluid channel formed within the support member. In one embodiment, a continuous flow of coolant is used to better control the temperature of the support member. The coolant is preferably 50 percent by volume ethylene glycol and 50 percent by volume water. Of course, any ratio of water and ethylene glycol can be used so long as the desired temperature of the substrate is maintained.

An etching gas mixture is introduced to the chamber for selectively removing various oxides on a surface of the substrate. In one embodiment, ammonia and nitrogen trifluoride gases are then introduced into the chamber to form the etching gas mixture. The amount of each gas introduced into the chamber is variable and may be adjusted to accommodate, for example, the thickness of the oxide layer to be removed, the geometry of the substrate being cleaned, the volume capacity of the plasma, the volume capacity of the chamber, as well as the capabilities of the vacuum system coupled to the chamber.

The ratio of the etching gas mixture may be predetermined to selectively remove various oxides on the substrate surface. The ratio of ingredient in the etching gas mixture may be adjusted to uniformly remove various oxides, such as thermal oxides, deposited oxides, and/or native oxides. In one embodiment, molar ratio of ammonia to nitrogen trifluoride in the etching gas mixture may be set to uniformly remove various oxides. In one embodiment, the gases are added to provide a gas mixture having at least a 1:1 molar ratio of ammonia to nitrogen trifluoride. In another embodiment, the molar ratio of the gas mixture is at least about 3 to 1 (ammonia to nitrogen trifluoride). In one embodiment, the gases are introduced in the chamber at a molar ratio of from 5:1 (ammonia to nitrogen trifluoride) to 30:1. In another embodiment, the molar ratio of the gas mixture is of from about 5 to 1 (ammonia to nitrogen trifluoride) to about 10 to 1. The molar ratio of the gas mixture may also fall between about 10:1 (ammonia to nitrogen trifluoride) and about 20:1.

In one embodiment, etching rate of the etching gas mixture may be adjusted by adjusting a flow rate of nitrogen trifluoride while maintaining a molar ratio of ammonia and nitrogen trifluoride above a predetermined value. In one embodiment, etching rate may be increased or decreased by increasing or decreasing the flow rate of nitrogen trifluoride while the ratio of ammonia and nitrogen trifluoride remains above about 3:1

A purge gas or carrier gas may also be added to the etching gas mixture. Any suitable purge/carrier gas may be used, such as argon, helium, hydrogen, nitrogen, or mixtures thereof, for example. Typically, the overall etching gas mixture is from about 0.05% to about 20% by volume of ammonia and nitrogen trifluoride. The remainder being the carrier gas. In one embodiment, the purge or carrier gas is first introduced into the chamber before the reactive gases to stabilize the pressure within the chamber.

The operating pressure within the chamber can be variable. Typically, the pressure is maintained between about 500 mTorr and about 30 Torr. In one embodiment, the pressure is maintained between about 1 Torr and about 10 Torr. More preferably, the operating pressure within the chamber is maintained between about 3 Torr and about 6 Torr.

An RF power of from about 5 and about 600 Watts is applied to an electrode disposed in the chamber above the substrate support member to ignite a plasma of the gas mixture within the chamber. Preferably, the RF power is less than 100 Watts. In one embodiment, the frequency at which the power is applied is very low, such as less than 100 kHz. In one embodiment, the frequency ranges from about 50 kHz to about 90 kHz.

The plasma energy dissociates the ammonia and nitrogen trifluoride gases into reactive species that combine to form a highly reactive ammonia fluoride ($NH_4F$) compound and/or ammonium hydrogen fluoride ($NH_4F.HF$) in the gas phase. These molecules react with the substrate surface to be processed. In one embodiment, the carrier gas is first introduced into the chamber, a plasma of the carrier gas is generated, and then the reactive gases, ammonia and nitrogen trifluoride, are added to the plasma.

Not wishing to be bound by theory, it is believed that the etchant gas, $NH_4F$ and/or $NH_4F.HF$, reacts with the silicon oxide surface to form ammonium hexafluorosilicate $(NH_4)_2SiF_6$, $NH_3$, and $H_2O$ products. The $NH_3$, and $H_2O$ are vapors at processing conditions and removed from the chamber by a vacuum pump. A thin film of $(NH_4)_2SiF_6$ is left behind on the substrate surface. This reaction mechanism can be summarized as follows:

$$NF_3 + 3NH_3 \rightarrow NH_4F + NH_4F \cdot HF + N_2$$

$$6NH_4F + SiO_2 \rightarrow (NH_4)_2SiF_6 + 2H_2O + 4NH_3$$

$$(NH_4)_2SiF_6 + heat \rightarrow 2NH_3 + 2HF + SiF_4$$

After the thin film is formed on the substrate surface, the support member may be elevated to an anneal position in close proximity to a heated gas distribution plate. The heat radiated from the gas distribution plate may dissociate or sublimate the thin film of $(NH_4)_2SiF_6$ into volatile $SiF_4$, $NH_3$, and HF products. These volatile products are then removed from the chamber by the vacuum pump as described above. Typically, a temperature of 75° C. or more is used to effectively sublimate and remove the thin film from the substrate. Preferably, a temperature of 100° C. or more is used, such as between about 115° C. and about 200° C.

The thermal energy to dissociate the thin film of $(NH_4)_2SiF_6$ into its volatile components is transferred by the gas distribution plate through convection or radiation. In one aspect, the distribution plate is heated to a temperature of between 100° C. and 150° C., such as about 120° C.

Once the film has been removed from the substrate, the processing chamber is purged and evacuated. The processed substrate is then removed from the chamber by lowering the substrate member to the transfer position, de-chucking the substrate, and transferring the substrate through a slit valve opening.

EXAMPLE

During etching, a gas mixture of 14 sccm of $NF_3$, 70 sccm of $NH_3$ was introduced into a vacuum chamber. In one embodiment, the flow rate of $NF_3$ may be adjusted to obtain a slower or faster etching rate. In one embodiment, the flow rate $NF_3$ may be between increased to 15 sccm for a faster etching rate, or reduced to 13 sccm for a slower etching rate. A plasma of the gas mixture was ignited. 1,500 sccm of argon is supplied to a lower portion of the chamber for bottom purge. 50 sccm of argon is supplied to near the edge region of the substrate support for edge purge. The chamber pressure was maintained at about 6 Torr, and the substrate temperature was about 22° C. The substrate was etched for 120 seconds.

During anneal, the spacing between the substrate and a heated chamber lid was 750 mil and the lid temperature was 120° C. The substrate was annealed for about 60 seconds. About 50 angstroms of material was removed from the substrate surface. No anneal effect was observed.

Unless otherwise indicated, all numbers expressing quantities of ingredients, properties, reaction conditions, and so forth, used in the specification and claims are to be understood as approximations. These approximations are based on the desired properties sought to be obtained by the present invention, and the error of measurement, and should at least be construed in light of the number of reported significant digits and by applying ordinary rounding techniques. Further, any of the quantities expressed herein, including temperature, pressure, spacing, molar ratios, flow rates, and so on, can be further optimized to achieve the desired etch selectivity and particle performance.

Additional description of methods and apparatus for SICONI™ etching method can be found in the United States Patent Application Publication 2007/0123051, entitled "Oxide Etch with $NH_3$-$NF_3$ Chemistry", which is incorporated herein by reference.

Even though, a dry etching method is described here, any suitable etching method may be used in accordance with embodiment of the present invention.

Referring back to FIG. 6, block 655 of the sequence 600 comprises depositing a third insulative layer 509. Block 660 of the sequence 600 comprises depositing a polycrystalline silicon layer 510 in the recesses 506. The polycrystalline silicon 510 is configured to form control gates. It is known to person skilled in the art but omitted in present application for simplicity that patterning and via formation are usually performed prior to formation of the control gates.

As shown in FIG. 5D, the distances between control gates formed in the polycrystalline silicon 510 and the active areas 501a are increased because of the rounded corners 508.

Figure 7:
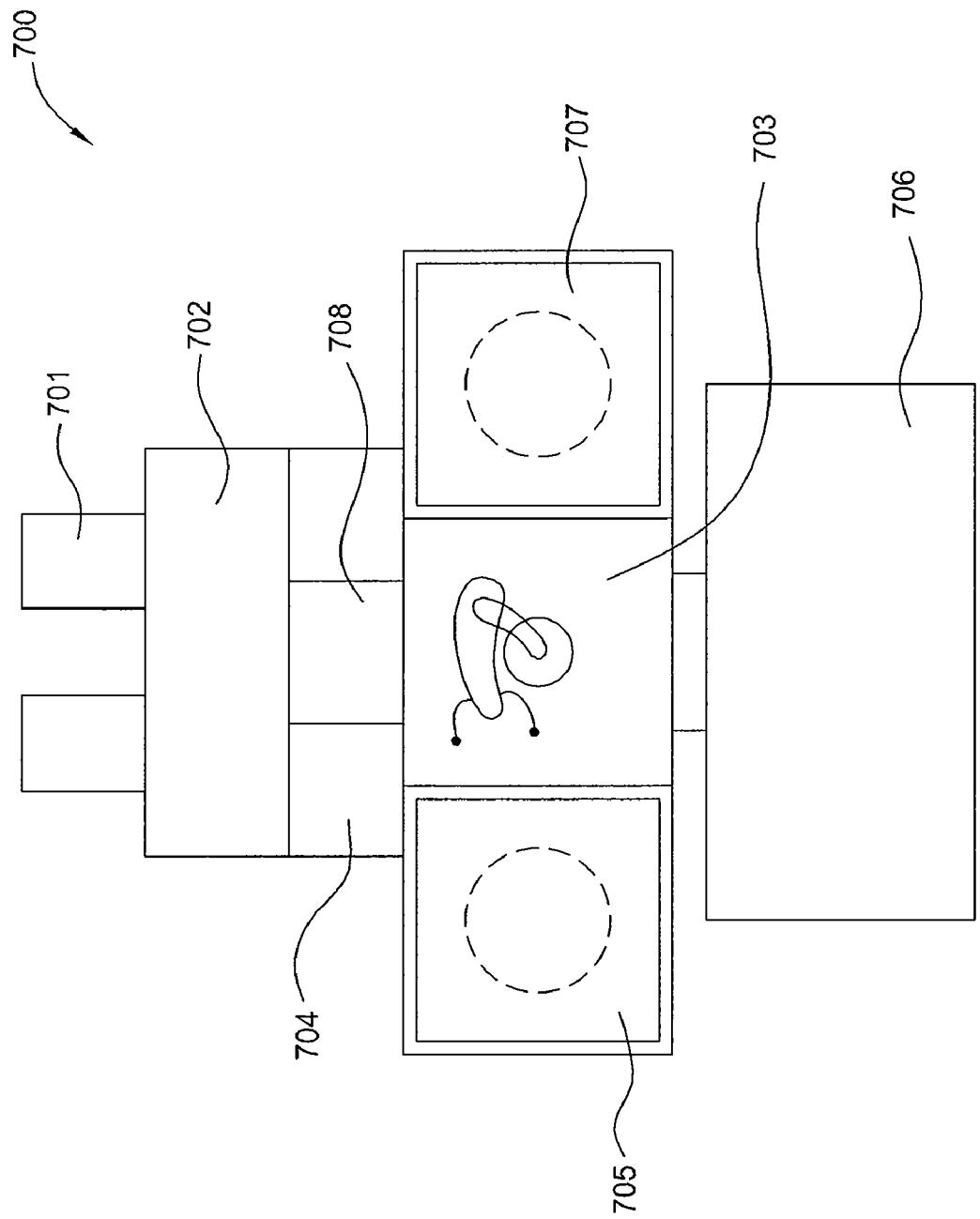
FIG. 7 is a schematic plan view of a cluster tool for forming a shallow trench isolation structure in accordance with one embodiment of the present invention.

FIG. 7 is a schematic plan view of a cluster tool 700 for forming a shallow trench isolation structure with rounded bottom corners in accordance with one embodiment of the present invention.

The cluster tool 700 generally comprises a factory interface 702 configured to provide passage to substrates between substrate transfer PODs 701 and a transfer chamber 703. In one embodiment, the transfer chamber 703 is maintained in a vacuum condition and a load lock chamber 708 may be coupled between the transfer chamber 703 and the factor interface 702.

A deposition chamber 705, a polishing system 706, and an etch chamber 707 are connected to the transfer chamber 703. A transfer robot 704 is generally disposed in the transfer chamber 703 and is configured to transfer substrates among the deposition chamber 705, the polishing system 706, and the etch chamber 707.

During process, substrates having trench structures formed therein are transferred to the transfer chamber 703 sequentially.

First, the transfer robot 704 transfers a substrate to be processed to the deposition chamber 705, wherein silicon oxide are deposited over the substrate to filled the trench structures.

The transfer robot 704 then retrieves the substrate with filled trench structures from the deposition chamber 705 and transfers the substrate to the polishing system 706. The polishing system 706 planarizes the substrate. The planarized substrate is similar to the substrate 501 of FIG. 5A.

The transfer robot 704 then retrieves the planarized substrate from the polishing system 706 and transfers the substrate to the etch chamber 707. The etch chamber 707 removes a portion of filled silicon oxide from the filled trench structure forming a recess in each trench structure. In one embodiment, the etch chamber 707 uses a dry etching method as described above. The etched substrate is similar to the substrate 501 of FIG. 5B.

The transfer robot 704 then retrieves the etched substrate from the etch chamber 707 and transfers the substrate back to the deposition chamber 705. Process parameters of the deposition chamber 705 are changed from trench filling to forming a thin conformal layer. In one embodiment, only length of deposition is adjusted for the deposition chamber 705 to switch between trench filling and conformal layer deposition. A conformal layer of silicon oxide is then formed on the substrate. After this deposition step, the substrate is similar to the substrate 501 of FIG. 5C.

The transfer robot 704 then retrieves the substrate from the deposition chamber 705 and transfers the substrate to the etch chamber 707 again. Process parameters of the etch chamber 707 are adjusted from recess formation to removal of the thin conformal layer. In one embodiment, only length of etching time is adjusted for the etch chamber 707 to switch between the two processes. Rounded corners are then formed in the recesses. After this etching step, the substrate is similar to the substrate 501 of FIG. 5D.

After removal of the conformal layer, the transfer robot 704 retrieves the substrate from the etch chamber 707 and returns the substrate to the factor interface 702 for subsequence processing.

Application on 3D Transistors

Embodiments of the present invention may be used to adjust recesses for wrap around gates for forming 3D transistors.

FIG. 8A-8D schematically illustrate a sequence of forming a shallow trench isolation structure for a three dimensional transistor in accordance with one embodiment of the present invention.

Figure 8B:
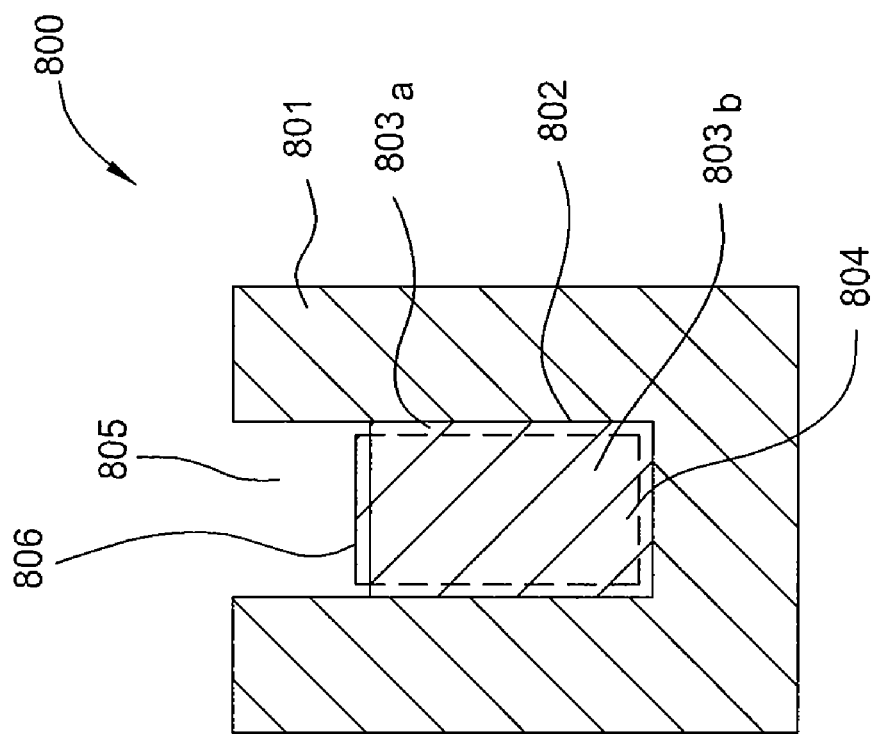
Figure 8A:
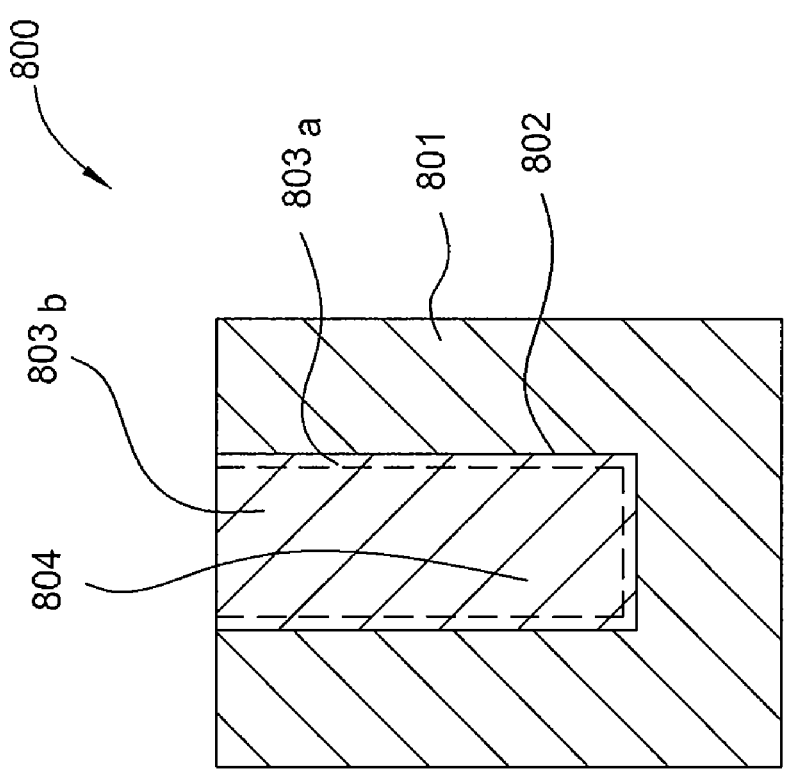

During formation of 3D transistors, a trench structure 802 is formed in a silicon body 801 as shown in FIG. 8A. The trench structure 802 is configured to separate the silicon body 801 into different regions for sources and drains in transistors. Silicon oxide 804 is generally filled in the trench structure 802 and then partially removed from the trench structure 802 forming a recess 805 in the trench structure 802. Gate material is then deposited over the recess 805 and wraps around the source and drain regions.

It is desirable to have flat bottom in the recess 805. However, because the silicon oxide 804 filled in the trench structure 802 generally comprises two kinds of silicon oxides 803a and 803b deposited in the trench structure 802 by different methods, therefore has different etching resistance. As a result, the recess 805 has a top profile 806 which is curved, as shown in FIG. 8B. The top profile 806 illustrates that the silicon oxide 803a is etched faster than the silicon oxide 803b.

To adjust the top profile 806, a conformal layer 807 of silicon oxide may be deposited on the recess 805. The thickness of the conformal layer 807 may be determined by a target profile, for example, a thicker conformal layer 807 is generally desired if the target profile is concave. Deposition of the conformal layer 807 is similar to deposition of a conformal layer described in methods 400 and 800.

An etching process is then performed to remove at least a portion of the conformal layer 807. By adjusting parameters of etching process, a flat top profile 808 can be achieved. In one embodiment, the etching process may be similar to the siconi etching described in block 650 of the sequence 600.

Embodiments of the present invention allow formation of rounded corners in a recess of a shallow trench structure without additional processing chambers and additional processing chemistry. Therefore, crosstalk among semiconductor devices, such as memory cells, may be reduced with minimal increase to cost of production.

Even though, formation of a shallow trench isolation with a recess having rounded corners is described in association with the present application, embodiments of the present application may be used in any suitable situation wherein recesses with rounded corners are called for.

While the foregoing is directed to embodiments of the present invention, other and further embodiments of the invention may be devised without departing from the basic scope thereof, and the scope thereof is determined by the claims that follow.

What is claimed is:

1. A method for processing a substrate, comprising:
    forming a trench structure in the substrate, wherein sidewalls of the trench structure comprises a first material;
    depositing a second material to fill the trench structure;
    planarizing the substrate to remove the first material deposited outside the trench structure;
    forming a recess in the filled trench structure by removing a portion of the second material from the filled trench structure; and
    adjusting a profile of the recess comprising:
        depositing a conformal layer of the second material over the substrate; and
        removing the conformal layer of the second material to expose the first material outside the trench structure.

2. The method of claim 1, wherein adjusting a profile of the recess comprises flattening a top surface of the second material in the recess.

3. The method of claim 1, wherein adjusting a profile of the recess comprises rounding bottom corners of the recess.

4. The method of claim 3, wherein removing the conformal layer of the second material comprises etching the substrate using an etchant having a higher etching rate against the second material than against the first material.

5. The method of claim 4, wherein forming the recess in the filled trench structure comprising etching the substrate using the etchant.

6. The method of claim 5, wherein the second material comprises silicon oxide.

7. The method of claim 6, wherein depositing the second material to fill the trench structure and the depositing the conformal layer of the second material are performed using the same chemistry.

8. The method of claim 6, wherein the etchant comprises a gas mixture of ammonia and nitrogen trifluoride, and removing the conformal layer of the second material comprises generating a plasma of the gas mixture of ammonia and nitrogen trifluoride.

9. A method for processing a substrate, comprising:
    forming a trench structure through a layer of polycrystalline silicon;
    filling the trench structure with silicon oxide;
    planarizing the substrate to expose the layer of polycrystalline silicon on a surface of the substrate;
    etching back the silicon oxide to in the trench structure to form a recess in the trench structure; and
    rounding bottom corners of the recess comprising:
        depositing a conformal layer of silicon oxide over the surface of the substrate, and sidewalls and bottom of the recess; and
        removing the conformal layer of silicon oxide to expose the layer of polycrystalline silicon on the surface of the substrate.

10. The method of claim 9, further comprising depositing a layer of an insulative material over the trench structure prior to filing the trench structure with silicon oxide.

11. The method of claim 10, wherein removing the conformal layer of silicon oxide is performed using an etchant having a higher etching rate against silicon oxide than against polycrystalline silicon.

12. The method claim 11, wherein etching back the silicon oxide is performed using the same etchant used in removing the conformal layer of silicon oxide.

13. The method of claim 12, wherein the etchant comprises a gas mixture of ammonia and nitrogen trifluoride, and removing the conformal layer of silicon oxide comprises generating a plasma of the gas mixture of ammonia and nitrogen trifluoride.

14. The method of claim 9, wherein forming the trench structure comprises forming the trench structure through polycrystalline silicon layer and into a silicon layer below the polycrystalline silicon layer, and the recess is formed within a thickness of the polycrystalline silicon layer.

15. The method of claim 10, wherein removing the conformal layer of silicon oxide is performed by a dry etching method or a wet etching method.

16. A method for processing a substrate, comprising:
depositing a first polycrystalline silicon layer on a first insulative layer disposed on a silicon substrate;
forming trench structures through the first polycrystalline silicon layer and the first insulative layer and into the silicon substrate;
depositing a silicon oxide material over the first polycrystalline silicon layer while filling the trench structures with the silicon oxide material;
planarizing and removing a portion of the silicon oxide material to expose the first polycrystalline silicon layer;
forming recesses having rounded bottom corners within the silicon oxide material disposed in the trench structure; and
depositing a second polycrystalline silicon layer over the first polycrystalline silicon layer while filling the recesses with rounded bottoms,
wherein forming the recesses having rounded bottom corners comprises:
etching a first portion of the silicon oxide material to form recesses having sharp bottom corners within the silicon oxide material disposed in the trench structures;
depositing a conformal silicon oxide layer on the recesses with sharp bottom corners; and
removing the conformal silicon oxide layer and etching a second portion of the silicon oxide material to form the recesses with rounded bottom corners.

17. The method of claim 16, further comprising:
depositing a second insulative layer within the trench structures prior to filling the trench structures with the silicon oxide material.

18. The method of claim 17, wherein etching the first portion of the silicon oxide material to form recesses having sharp bottom corners comprises applying an etchant that etches the silicon oxide material at a greater rate than the first polycrystalline silicon layer and the second insulative layer.

19. The method of claim 18, wherein removing the conformal silicon oxide layer and etching the second portion of the silicon oxide material comprises applying the same etchant used in etching the first portion of the silicon oxide material in the trench structures.

20. The method of claim 19, wherein the etchant comprises a plasma generated from a gas mixture of ammonia and nitrogen trifluoride.

\* \* \* \* \*

UNITED STATES PATENT AND TRADEMARK OFFICE
CERTIFICATE OF CORRECTION

PATENT NO. : 8,043,933 B2
APPLICATION NO. : 12/620806
DATED : October 25, 2011
INVENTOR(S) : Kao et al.

Page 1 of 1

It is certified that error appears in the above-identified patent and that said Letters Patent is hereby corrected as shown below:

In the Detailed Description:

Column 8, Line 57, please delete "($NH_4F.HF$)" and insert --($NH_4F \cdot HF$)-- therefor;

Column 8, Line 64, please delete "($NH_4F.HF$)" and insert --($NH_4F \cdot HF$)-- therefor;

Column 9, Line 4, please delete "$NF_3 + 3NH_3 \rightarrow NH_4F + NH_4F.HF + N_2$" and insert --$NF_3 + 3NH_3 \rightarrow NH_4F + NH_4F \cdot HF + N_2$-- therefor.

Signed and Sealed this
Tenth Day of January, 2012

David J. Kappos
*Director of the United States Patent and Trademark Office*